United States Patent
Hoffman et al.

(10) Patent No.: US 7,500,129 B2
(45) Date of Patent: Mar. 3, 2009

(54) ADAPTIVE COMMUNICATION INTERFACE

(76) Inventors: Jeffrey D. Hoffman, 4821 W. Flint St., Chandler, AZ (US) 85226; Allan R. Bjerke, 3128 E. Muirwood Dr., Phoenix, AZ (US) 85048

( * ) Notice: Subject to any disclaimer, the term of this patent is extended or adjusted under 35 U.S.C. 154(b) by 812 days.

(21) Appl. No.: 10/976,572

(22) Filed: Oct. 29, 2004

(65) Prior Publication Data
US 2006/0117231 A1    Jun. 1, 2006

(51) Int. Cl.
*H04L 7/00* (2006.01)
(52) U.S. Cl. .................... 713/401; 713/400
(58) Field of Classification Search ............. 713/400, 713/401
See application file for complete search history.

(56) References Cited

U.S. PATENT DOCUMENTS

| | | | |
|---|---|---|---|
| 5,537,624 A * | 7/1996 | Whitesell | 710/307 |
| 6,049,882 A * | 4/2000 | Paver | 713/322 |
| 6,606,360 B1 * | 8/2003 | Dunning et al. | 375/354 |
| 6,694,385 B1 * | 2/2004 | Fuoco et al. | 710/8 |
| 7,069,458 B1 * | 6/2006 | Sardi et al. | 713/401 |
| 7,142,623 B2 * | 11/2006 | Sorna | 375/376 |

* cited by examiner

*Primary Examiner*—Tse Chen
(74) *Attorney, Agent, or Firm*—Blakely, Sokoloff, Taylor & Zafman LLP

(57) ABSTRACT

Embodiments of the invention include a communication interface and protocol for allowing communication between devices, circuits, integrated circuits and similar electronic components having different communication capacities or clock domains. The interface supports communication between any components having any difference in capacity and over any distance. The interface utilizes request and acknowledge phases and signals and an initiator-target relationship between components that allow each side to throttle the communication rate to an accepted level for each component or achieve a desired bit error rate.

8 Claims, 15 Drawing Sheets

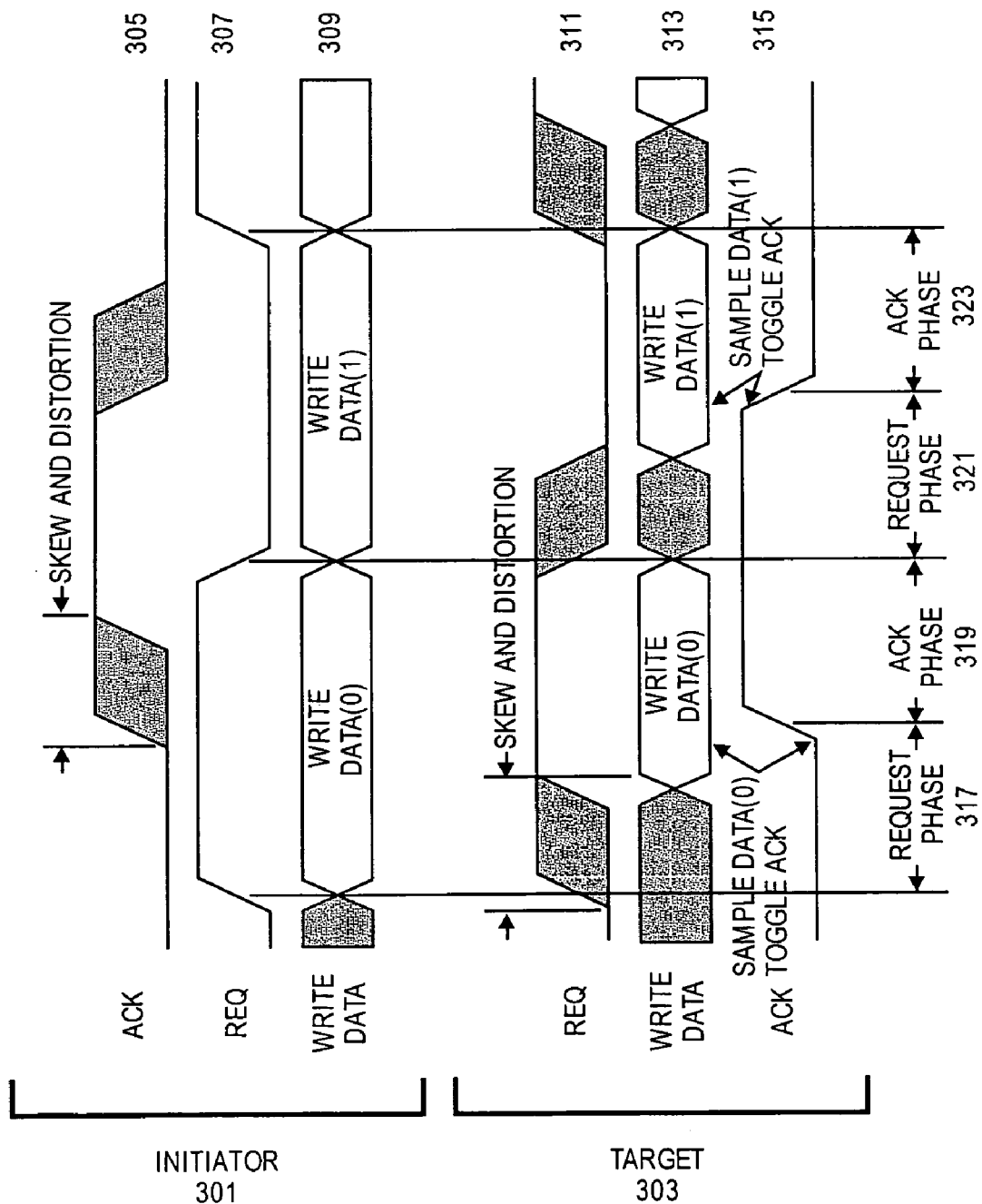

ADAPTIVE COMMUNICATION INTERFACE

BACKGROUND

1. Field of the Invention

The invention relates to communication interfaces and protocols. Specifically, embodiments of the invention relate to a method and apparatus for communicating between devices having different communication capacities, operating speeds and devices operating in different clock domains.

2. Background

Communication between components of a computer system across the printed circuit board (PCB) of a main board utilizes either parallel communication buses or serial communication buses. Conventional high speed parallel communication buses require very tight controls on the amount of skew or distortion on the communication lines. These tight requirements result in a difficult process for determining a proper layout of the communication lines on a PCB. The communication lines in a parallel bus must be balanced, have matching impedances and similar physical characteristics. These conventional high speed parallel buses do not support communication between devices with differing communication rates, capacities or speeds. Conventional high speed parallel buses make overall PCB layout and design more difficult and time consuming for main board manufacturers.

Conventional high speed serial communication buses avoid some of the problems of high speed parallel buses but require more complex digital signal processing by the components communicating over the high speed serial bus. High speed serial buses require the communicating components to determine clock recovery, undergo pre-emphasis of the serial line, perform synchronization and similar digital signal processing calculations. Components in a computer system that utilize high speed serial buses must devote significant resources and integrated circuit space to perform the requisite digital signal processing functions. High speed serial buses are also unable to support communication between devices having different communication capabilities. Neither high speed parallel nor serial buses support communication between components manufactured according to the most current communication and data rate standards and legacy components. This requires manufacturers to abandon the use of legacy components when a new communication standard is adopted in an industry.

BRIEF DESCRIPTION OF THE DRAWINGS

Embodiments of the invention are illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

FIG. 3 is an example timing diagram of a set of signals between an initiator component and target component during a write operation.

DETAILED DESCRIPTION

Figure 1:
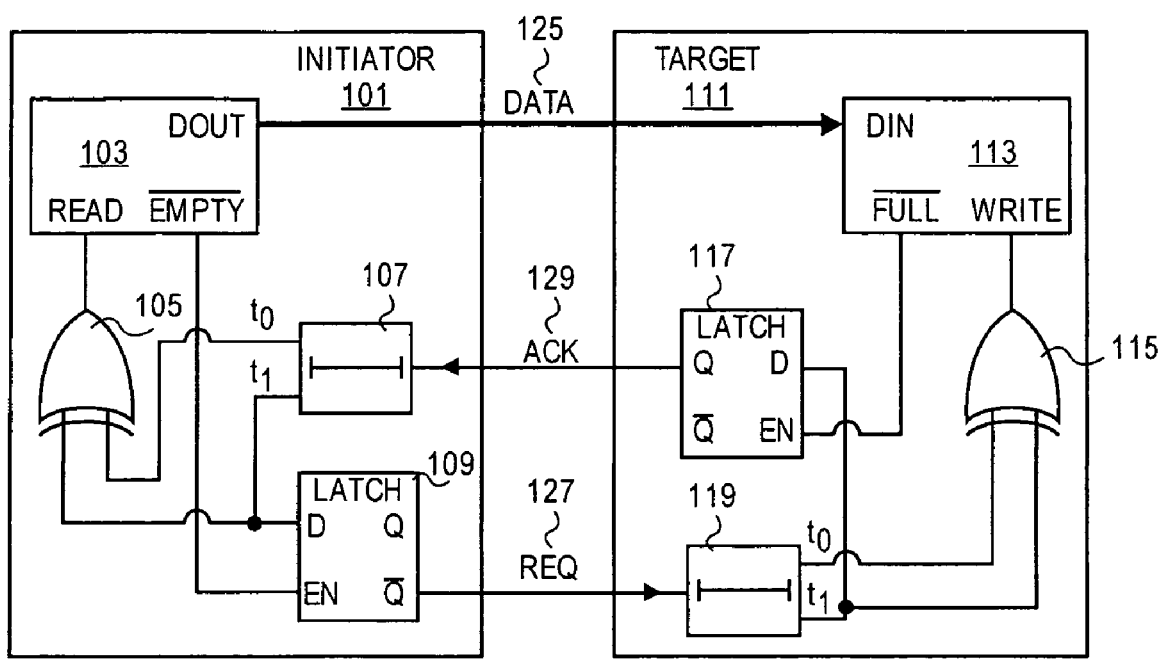
FIG. 1 is a diagram of one embodiment of an initiator component and a target component.

FIG. 1 is a diagram of one embodiment of a communication medium governed by an initiator component and target component interface in the context of a write operation. The communication medium may be any type of communication medium including parallel or serial lines in a bus on a printed circuit board or in an integrated circuit, optical or coaxial cabling between network devices or any other type of communication medium. The communication medium may have any capacity or speed. In one embodiment, the communication medium may be a data bus 125 or similar set of communication lines.

In one embodiment, this communication medium may be governed by an initiator component 101 and a target component 111 interface. The initiator component 101 may be situated in or in communication with a device that communicates over the communication medium. Similarly, the target component 111 may be situated in or in communication with a device to assist in managing communication over the communication medium. For example, the initiator-target interface may be used to govern communication between a central processing unit and a chipset on a main board. The initiator component 101 may be situated in the central processing unit and the target component 111 may be situated in the chipset. The devices associated with the initiator component 101 and target component 111 may have different operating speeds, clock domains, communication transfer rates or other dissimilarities in communication capabilities.

In one embodiment, in addition to the standard communication lines for transmitting and receiving data, the initiator-target component interface may have a dedicated request line 127 and dedicated acknowledgment line 129. These lines may be utilized by the interface to manage the flow of data over the standard communication lines. The initiator-target component interface may minimize the number of auxiliary communication lines required to manage communication over a communication medium. This also minimizes the needed number of pins on an integrated circuit or number of lines in a communication medium. In contrast, other communication interfaces or protocols require additional dedicated communication lines and pins to send a clock signal and other flow control signals. The initiator-target component interface may utilize two control signals in addition to the data lines required between the communicating devices. The standard data lines may communicate any type of data including command signals, storage data, program data, instruction data and similar data. The initiator-target component interface saves power and integrated circuit or main board space over traditional communication interfaces.

Figure 4:
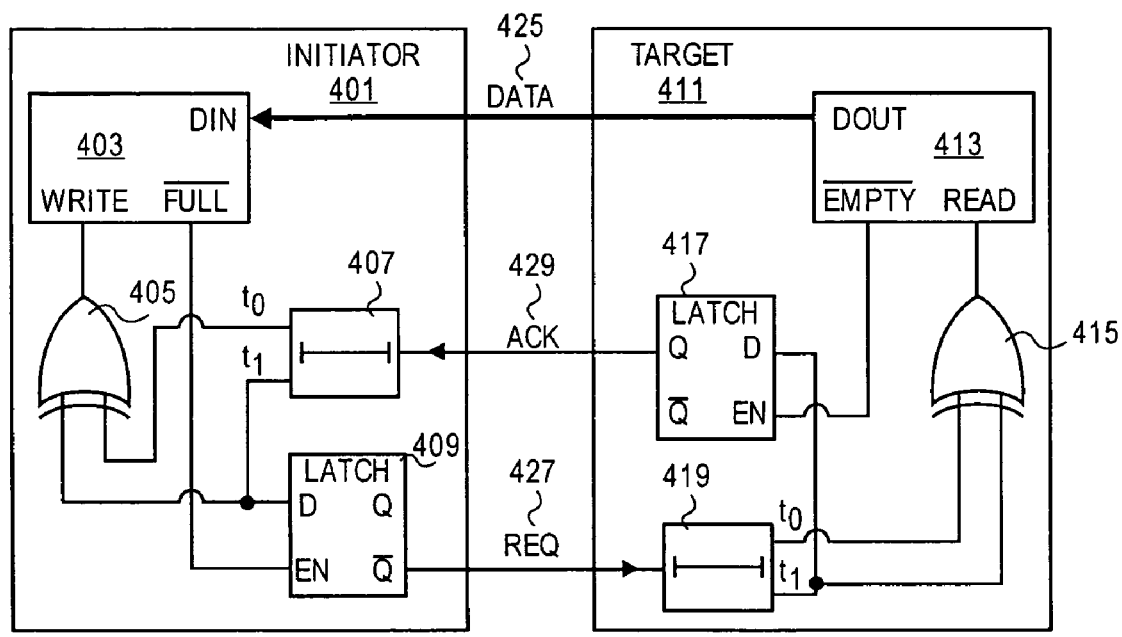
FIG. 4 is a diagram of one embodiment of an initiator component and target component.

In one embodiment, an initiator-target component interface may be utilized to manage communication over a communication medium between any two or more devices at any level of communication irrespective of relative communication capacities of the devices. The interface may be used within integrated circuits, chip to chip, device to device, in network communications and similar communication scenarios. The interface allows the devices utilizing the interface to throttle the communication speed over the communication medium to maximize throughput between the components without exceeding a desired bit error rate and within the communication capabilities of each device. In one embodiment, the initiator-target component interface may be capable of executing write operations from the initiator component to the target component and read operations from the target component to the initiator component. The initiator component may signal the initiation of a read operation before data is sent by the target component. FIGS. 1-3 relate to a write operation. FIGS. 4-6 relate to a read operation.

In one embodiment, the interface also may be utilized over any distance from short distances within integrated circuits to long distances between network devices. In addition to allowing the communicating devices to throttle the speed of communication the interface also adjusts the communication rate to account for skew and distortion of signals on the communication medium such as signal noise and reflection. The interface may be 'tuned' for communication over a specific medium and for specific devices or may be trained to dynamically adjust to changing conditions, communication mediums and devices. The interface may be utilized in conjunction with asynchronous devices and synchronous devices. The embodiment of the interface initially discussed in relation to FIGS. 1-7 is an asynchronous embodiment. A synchronous embodiment is discussed in relation to FIGS. 8A and 8B.

In one embodiment, the initiator component 101 may include or be in communication with a storage device 103. The storage device 103 may be any type of storage device including a set of buffers, set of registers, random access memory device, fixed storage device, or similar storage medium. The target component 111 may also include or be in communication with a storage device 113. This storage device 113 may also be a set of buffers or registers, a random access memory device, a fixed disk or similar storage medium. For example, in one embodiment, the storage devices associated with initiator component 101 and target component 111 may be buffers dedicated to communication over the communication medium for each device attached to the medium such as a buffer for a fixed disk or system memory device managed by the target component and a buffer in a chipset managed by a initiator component.

In one embodiment, the initiator component 101 may include a set of subcomponents that manage data flow over the communication medium. The subcomponents may include a delay module 107, signaling module 109 and control module 105. In one embodiment, the signaling module 109 may be a latch or similar circuit or structure. The signaling module 109 may be a toggle flip flop or equivalent component. The signaling module 109 may toggle the output on a request line 127 whenever data is available in storage device 103 to be transmitted to the target component 111. The signaling module 109 may only be enabled when data is available in the storage device 103. Enabling or disabling the signaling module 109 by the device associated with the initiator component 101 via the storage device 103 throttles the communication from the initiator component 101 end of the interface. The signaling module 109 may toggle the request line or similarly signal to indicate available data to write or signal that data may be received from the target component 111. The interface may utilize a non return to zero signaling protocol, which is quick and efficient in communicating between the initiator and target components.

In one embodiment, the initiator component 101 may include a delay module 107. Delay module 107 receives acknowledgment signals from a target component 111. In one embodiment, the delay device 107 may delay the propagation of the incoming acknowledgment signal and divide the signal into two separate outputs. The first output ($t_0$) may be a delayed propagation of the acknowledgement signal based on the time required to allow the acknowledgment line signal to settle into a new state thereby accounting for skew and distortion on the acknowledgment line as well as the data lines in the communication medium. The second signal ($t_1$) further delays the propagation of the acknowledged signal based on the manufacturing characteristics of the initiated component. The difference in time between $t_0$ and $t_1$ equates to a minimum pulse width necessary to strobe the storage device 103 based on the manufacturing characteristics of the storage device 103 and associated device. The $t_0$ and $t_1$ signals may be both propagated to the control module 105. The $t_1$ signal may also be propagated to the signaling module 109. For example, the initiator component 101 may be a part of a central processing unit with a 0.19 micron construction. The time difference between to and $t_1$ may correspond to the minimum time necessary to initiate a read operation to the storage device 103.

In one embodiment, the initiator component 101 includes control module 105. The control module 105 manages the signaling to the storage device 103 to initiate a read operation for the storage device 103 thereby initiating a send of the data over the communication medium. The control module 105 receives the $t_0$ and $t_1$ signals as inputs from the delay module 107. The control module 105 functions as a logical 'exclusive OR'. In one embodiment, the control module 105 may be implemented as a set of logical gates defining an exclusive OR operation. The control module 105 generates an output signal that strobes the storage device 103 to initiate a read of the storage device to present the data to be communicated over the communication medium such as a data bus 125. In one embodiment, the control module 105 may initiate a read after an acknowledgement signal has been received over acknowledgment line 129 and after a delay corresponding with the signal $t_0$. The incoming acknowledgment signal may indicate the readiness of the target component 111 to receive data from the initiator component 101. The control module 105 may cease to provide this read signal when the $t_1$ signal is received.

In one embodiment, the target component also includes a signaling module 117, delay module 119 and control module 115. These components mirror the function of the subcomponents in the initiator component 101. The delay module 119 may receive request signals from the initiator component 101. The delay module 119 may generate a first delayed signal ($t_0$) and a second delayed signal ($t_1$). The first signal, $t_0$, may have a delay corresponding to the skew and distortion associated with the request line 127. The $t_0$ signal may propagate to control module 115 that operates as a logical exclusive OR. The control module 115 may be implemented as a set of logical gates that function as an exclusive OR or a similar module capable of signaling to storage device 113 to write the incoming data on the communication medium 125 into the storage device 113. The $t_1$ signal may be propagated after a further delay corresponding to the manufacturing characteristics of the target component 111. The $t_1$ signal may be propagated to the control module 115 to end the signaling of a write to the storage device 113. The $t_1$ signal may also be propagated to signaling module 117.

In one embodiment, the signaling module 117 may be enabled for purposes of write operations provided storage device 113 is not full. When storage device 113 is not full and the $t_1$ signal is received, an acknowledgement signal may toggle acknowledgment line 129. The signaling module 117 may be implemented as a latch such as a toggle flip flop or circuit with similar functionality. The toggle of the signal to the initiator component 101 using the non return to zero protocol indicates that further data may be sent via a write operation to target component 111 to be written to storage device 113.

Figure 2A:
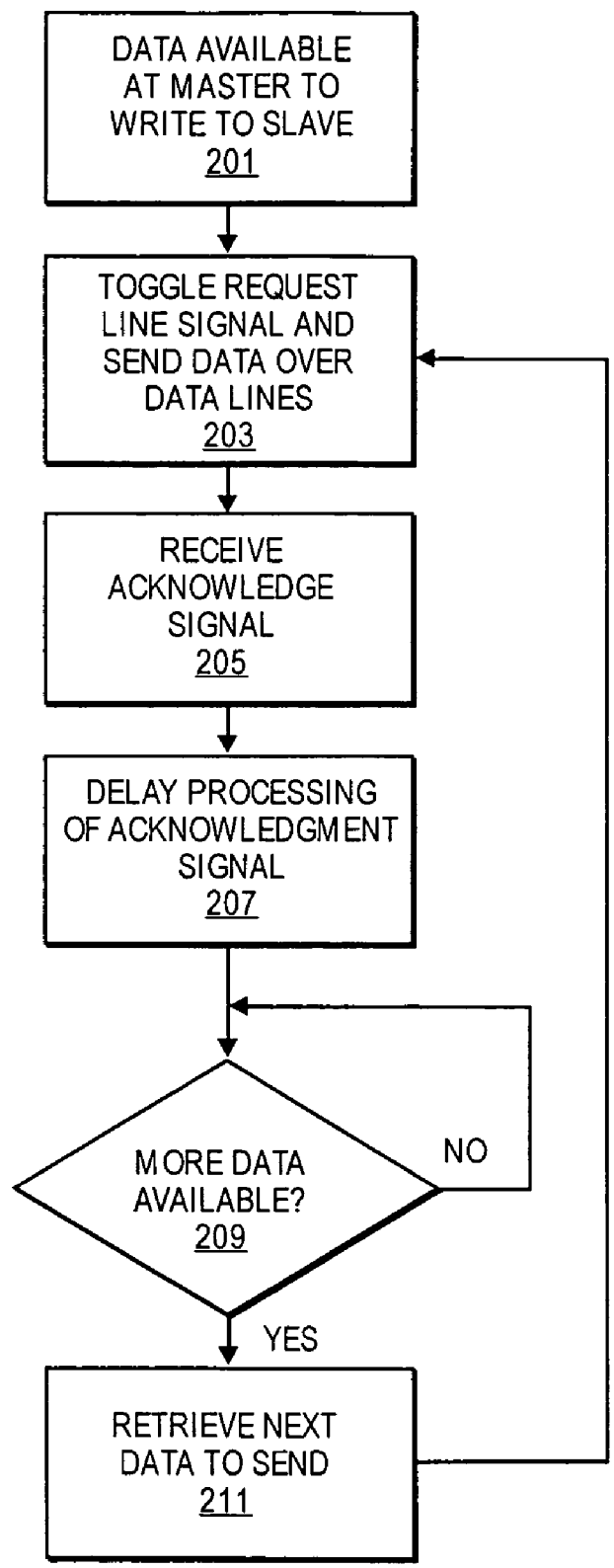
FIG. 2A is a flowchart of one embodiment of a process for initiating a write operation.

FIG. 2A is a flow chart of the operation of an initiator component during a write operation. In one embodiment, the availability of data to be written in a storage device associated with the initiator component starts the write operation process. During the write operation, data in the storage device associated with the initiator component is to be sent to the target component and stored in the storage device associated with the target component. In one embodiment, the availability of data may be determined by a 'not empty' indicator signal generated by the storage device associated with the initiator component. This signal may be propagated to the signaling module to enable the signaling of a request to a target component.

In one embodiment, the generation of a request signal may be a toggle of the signal on the request line using a non return to zero protocol and the data to be sent may be simultaneously presented on the communication medium such as a data bus (block 203). The initiator component may continue to present the data on the database that is to be written to the target component until an acknowledgement signal is received (block 205). The incoming acknowledgement signal may be delayed by a delay module before being propagated to the signaling module and control module (block 207). The incoming acknowledgement signal may be divided into two signals each with a separate period of delay. Both signals may be propagated to the control module. The first signal starts a read of the storage device and the second signal ends the read. The second signal may have a delay that differs from the first by the time period necessary to successfully signal the storage component to initiate a read and present the next data to be transmitted over the data bus. The second signal may also be propagated to the signaling component. In one embodiment, a check may be made to determine that further data is available in the storage device of the initiator component to transmit to the target component (block 209). If no data is available, then the initiator component will wait until further data is available. If data is available, then the next data to be sent is retrieved and presented on the communication medium (block 211). This process may continue by toggling the signal on the request line and presenting data over the communication medium (block 203).

Figure 2B:
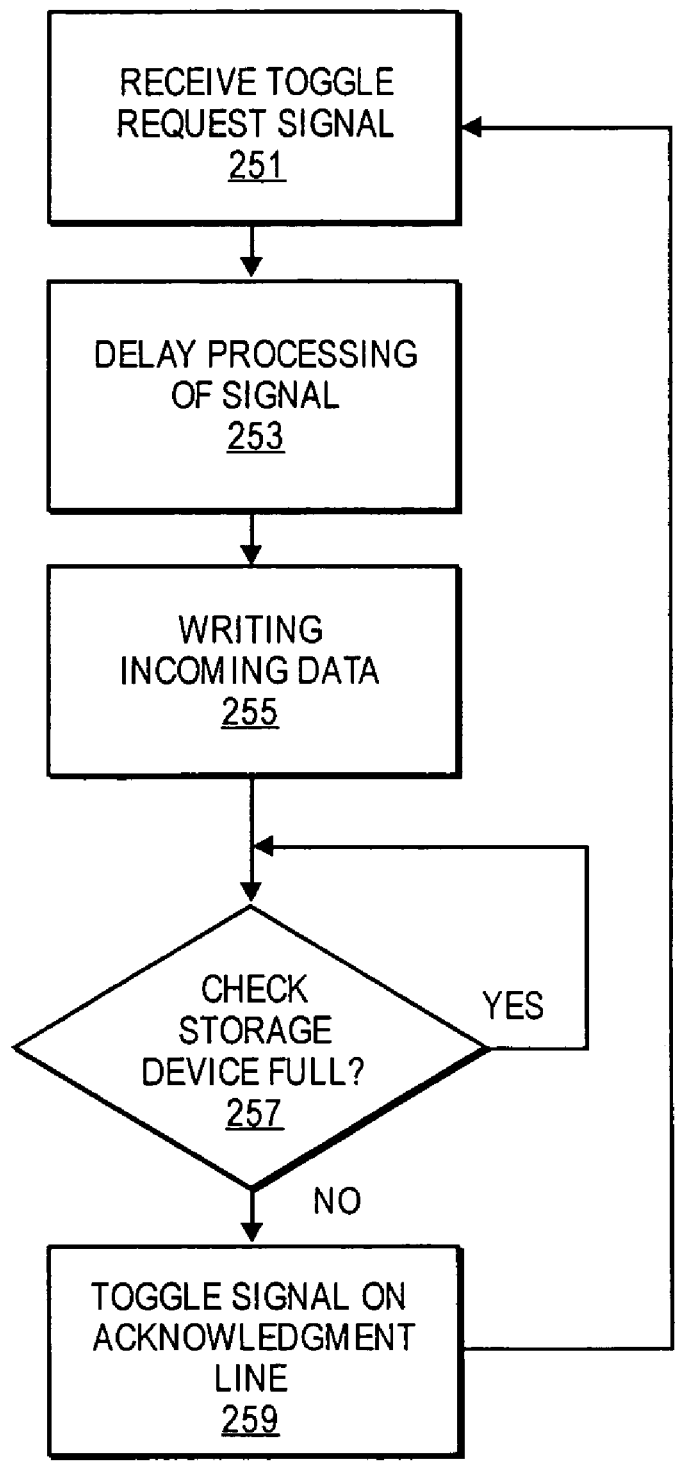
FIG. 2B is a flowchart of one embodiment of a process for handling a write operation at a target device.

FIG. 2B is a flow chart of one embodiment of the process for the write operation at the target component. In one embodiment, the communication process at the target component during a write operation may begin by receiving a toggled signal on the request line (block 251). This incoming signal indicates that the initiator component may be sending data over the connecting medium. However, this incoming request signal may be delayed in its processing by a delay module (block 253). The incoming request signal may be delayed to accommodate skew and distortion on the request and data lines and the signal may be split. The first signal may have a first delay corresponding to a required time of delay to accommodate skew and distortion on the request line. The second signal may be further delayed over the first signal to account for the delay needed to accommodate for the manufacturing characteristics of the target component. The delayed first signal may be propagated to the control module to initiate the writing of incoming data to the storage device associated with the target component (block 255). This write period is ended by the generation of the second delayed signal. The difference in the times of delay may correspond to the minimum pulse width needed to initiate a write for the storage component associated with the target component. The second delayed signal may also be propagated to a signaling module that toggles a signal on the acknowledgment line. This change in the acknowledgment line signal indicates to the initiator component that further data may be sent.

In one embodiment, this acknowledgement signal may only be generated, however, after a check of the storage device associated with the target component (block 257). If the storage device is full, then the signaling module stalls until the storage device has room to receive further data. If the storage device is not full, then the signaling module may toggle the signal on the acknowledgment line indicating to the initiator component that further data may be sent (block 259). The target component may then await a further request signal and data (block 251).

FIG. 3 is a timing diagram showing an example set of signals between an initiator component and target component during a write operation. In the example embodiment, the initiator component 301 may send data to the target component 303 to be written to the storage device associated with the target component 303. The process may begin by the initiator component 301 toggling the signal on the request line 307 employing a non return to zero signaling protocol. This may begin a first request phase 317 of the write process. This request signal may be received at the target component 303 after a skew and distortion of the line is settled 311. The data to be written may be presented on the data lines 309 at the beginning of the request phase 317. This write data may also be received at the target component 303 on the data lines 313 after the skew and distortion has been settled. In response, the target component 303 writes the data to the associated storage device and if that storage device has the capacity to receive further data then an acknowledgment signal is toggled on acknowledgement line 315 thereby beginning the acknowledgment phase 319.

In the example, the acknowledgment signal may be received by the initiator component 301 on acknowledgement line 305 after a period of skew and distortion has settled. In response, if further data is available to be written to the target component 303, the initiator component 301 may again toggle the request line signal 307 starting a second request phase 321. The next block of data to be written to the storage device associated with target component 303 may been presented on the outgoing data lines 309. The request signal and incoming data on the incoming request line 311 and incoming data lines 313 of the target component 303 may be received after skew and distortion on the lines has settled and device manufacturing characteristics accounted for. The target component 303 may then generates an acknowledgement signal if further data can be received by the storage device associated with the target component 303, hereby initiating the next acknowledgment phase 323 by toggling the acknowledgement line 315.

This process may continue until all of the data available in the storage device associated with the initiator component 301 has been successfully sent to the target component 303 and stored in the storage device associated with the target component 303.

FIG. 4 is a diagram of one embodiment of the interface in the context of a read operation. During a read operation, the data requested by an initiator component 401 may be sent from the target component 411. The operation of the initiator component 401 and the target component 411 during the read operation may be similar to the behavior of the components during the write operation. However, the initiator component 401 may still be responsible for starting the process. Initiator component 401 may have a storage device 403 that generates a signal that enables the signaling module 409, so long as the storage device is not full. The initiator component may also include a delay module 407 that receives the acknowledgment signal from the target component 411 and delays propagation of the acknowledgment signal to account for skew and distortion on the acknowledgment line 429 before triggering a write of the incoming data through control module 409. The delay module 407 may also divide the acknowledgment signal and further delay the second signal based on the manufacture characteristics of the initiated component to produce a minimum pulse width for the write signal and to generate the next request signal via the signaling module 409 if storage device 403 is not full.

In one embodiment, the target component 411 may include a storage device 413 that enables the signaling module 417 so long as the storage device associated with the target component is not empty. The target component 411 may include a delay module 419 that propagates a first delayed signal based on an incoming request signal. This first delayed signal may be propagated to the control module 415 that starts the read operation for the storage device 413 and transmits the data over the communication medium such as data bus 425. This read operation is ended by a second delay signal that is generated after the first signal. The difference in delay time may be based on a manufacture of the target component 411 to produce a minimum pulse width necessary for the target component 411 to conduct a read operation. In one embodiment, the second delay signal may be propagated to the signaling module 417, which generates an acknowledgment signal that accompanies the transmission of data over the communication medium such as data bus 425.

Figure 5A:
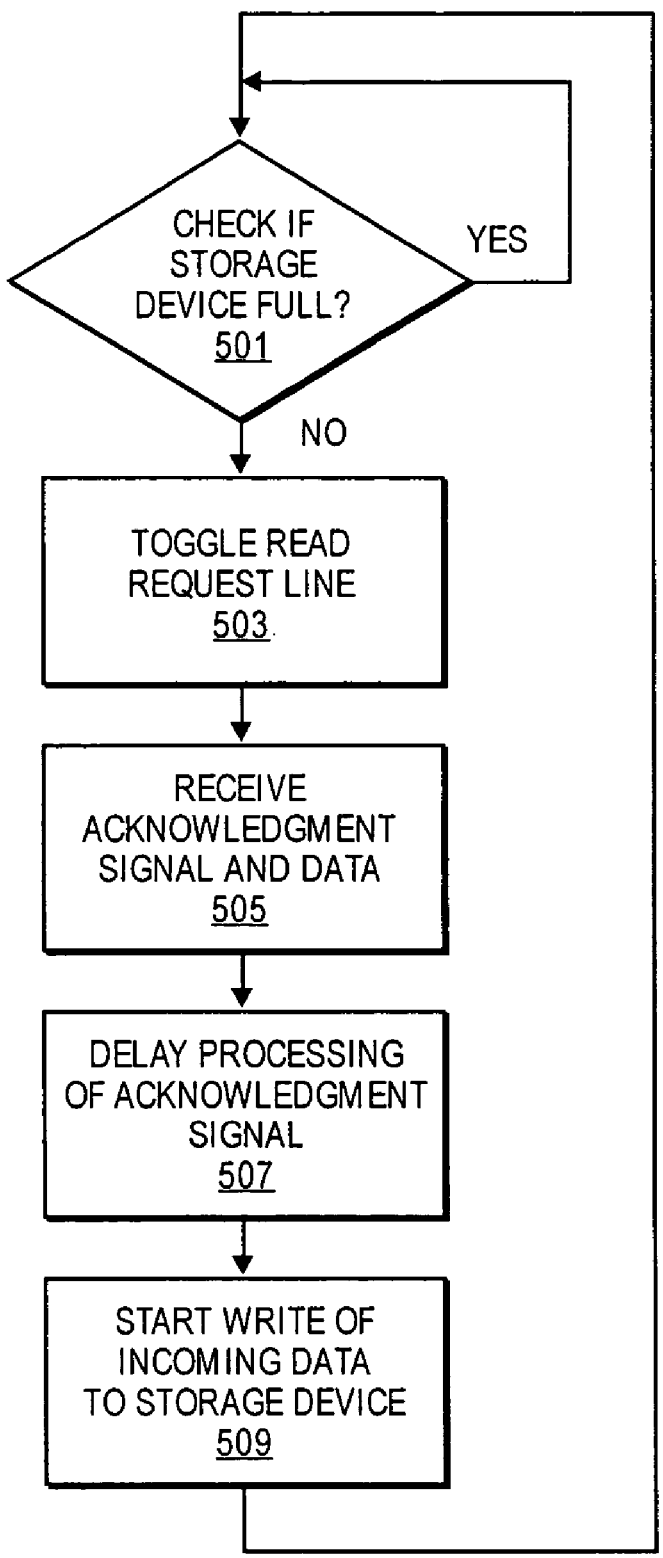
FIG. 5A is a flowchart of one embodiment of a process for initiating a read operation.
Figure 6:
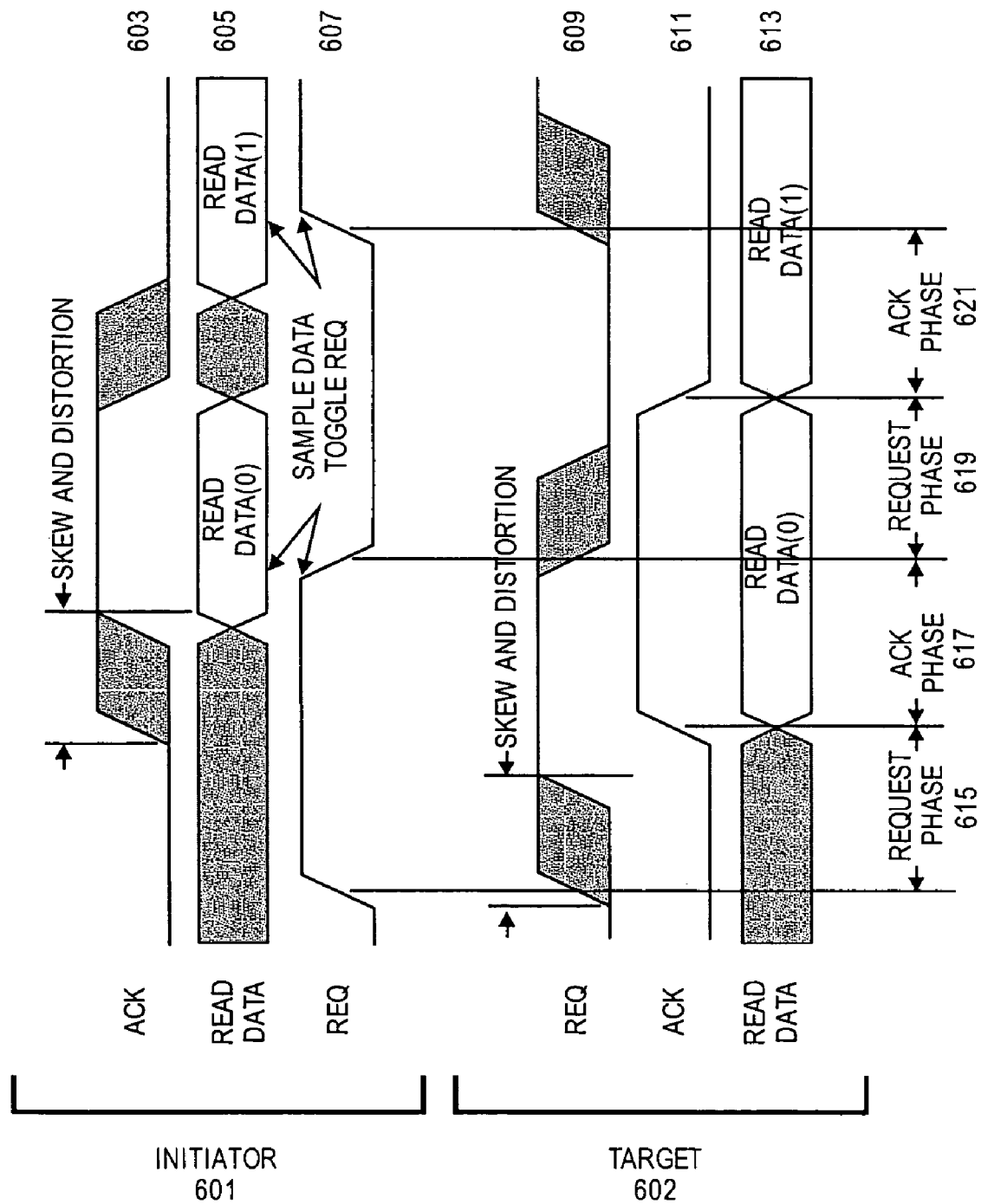
FIG. 6 is an example timing diagram of signals between an initiator component and target component during a read operation.

FIG. 5A is a flowchart of one embodiment of the process for a read operation in an initiator component. In one embodiment, the read operation may check an associated storage device to determine if sufficient space is available in the storage device to receive incoming data (block 501). If sufficient space does not exist, then the initiator component may not enable the start of the read processing until sufficient space becomes available. If sufficient space is available, then a signaling module in the initiator component may toggle a signal on the request line indicating to the target component that the initiator component is ready to receive data (block 503). The initiator component then awaits the reception of an acknowledgment signal and accompanying request data (block 505).

In one embodiment, an acknowledgement signal may be received at the delayed module in the initiator component. The delay module may delay processing of the acknowledgment signal until the skew and distortion are settled on the acknowledgment and data lines. The acknowledgment signal may be propagated to the storage device via the control module to start the write of incoming data to the storage device (block 509). A further delayed signal where the further delay may be based on the manufacture type of the initiator component ends the signaling of a write of the incoming data via the control module. The read process may continue to request data or may stall the process if the check of the storage device indicates that the storage device is full thereby maintaining control of the speed of the communication (block 501).

Figure 5B:
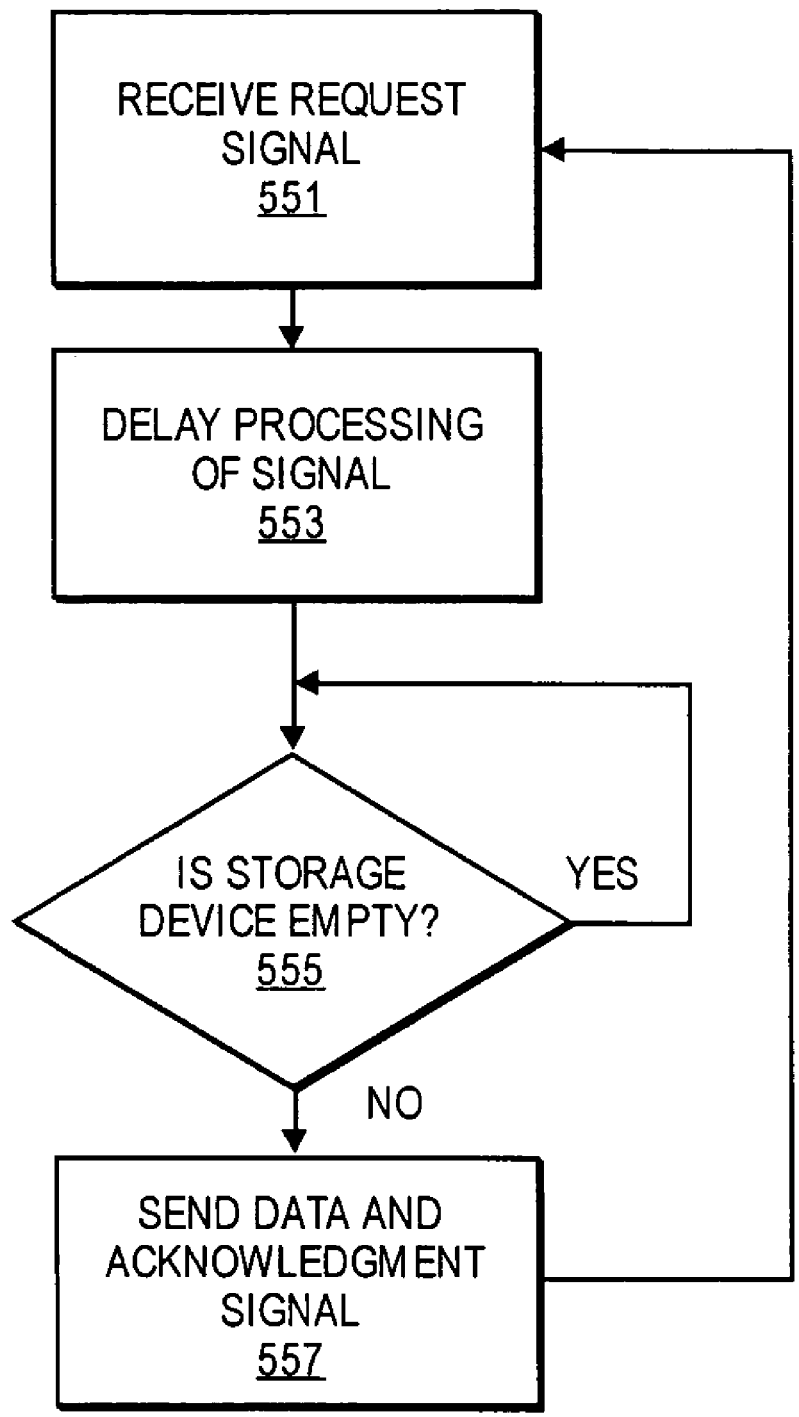
FIG. 5B is a flowchart of one embodiment of a process for handling a read request at a target component.

FIG. 5B is a diagram of one embodiment of the process for receiving and processing a read request at the target component. In one embodiment, the process for handling a read operation at the target component begins by receiving a request signal on the incoming request line (block 551). This request signal may be a toggle of the signal on the request line by the initiator component. This incoming request signal may be received by the delay module. The delay module may delay the propagation of this signal to the rest of the target component (block 553). The received signal may be divided into two signals. The first signal may be delayed for a time period corresponding to that necessary to settle skew and distortion of the incoming signal. This first signal is then propagated to the control module that initiates the read of the storage device associated with the target component and places the requested data on a communication medium. The second delay signal is propagated after a further delay corresponding to the minimum delay time necessary to produce a signal via the control module that is capable of properly initiating a read of the storage device. The second delayed signal also propagates to the signaling module. A check may be made to determine if the storage device contains data, that is, it has data to send to the initiator component (block 555). If the storage device is empty then the target component stalls until data is available. If the storage device is not empty, then the data may be sent over the communication medium and the acknowledge signal may be sent to the initiator component indicating that further requests may be made (block 557). This process may continue when the next request signal is received (block 551).

FIG. 6 is a timing diagram of one embodiment of an example read operation between an initiator component and target component. The timing diagram shows that the initiator component 601 may start the read operation by toggling a request line 607. The request may be received at the target component 602 on incoming request line 609 after a period of skew and distortion. The sending of the request signal may start the request phase 615. Upon receiving the request signal of the target component 602 and after a defined delay if the target component has data to return an acknowledgment signal may be toggled on acknowledgment line 611 and the data requested may be presented on the data lines 613 of the communication medium. Sending of the acknowledgement signal and presentation of the data on the data lines starts an acknowledgement phase 617.

In one embodiment, the acknowledgment signal may be received at the initiator component on incoming acknowledgement line 603 after a period of skew and distortion settle. The read data is also received at the same time on the incoming data lines 605. After a delay corresponding to the skew and distortion period and manufacturing technology of the initiator component, a request signal may be sent over the request line 607 indicating further read data may be sent. Further requests may be generated if the initiator component has sufficient space to store incoming data. A generation of the second request signal starts the second request phase 619. The target component receives the incoming request signal on request line 609 and in response generates an acknowledging signal and presents the next data block on data lines 613 in a new acknowledgement phase 621, if there is data available in a storage device for the target component.

Figure 7:
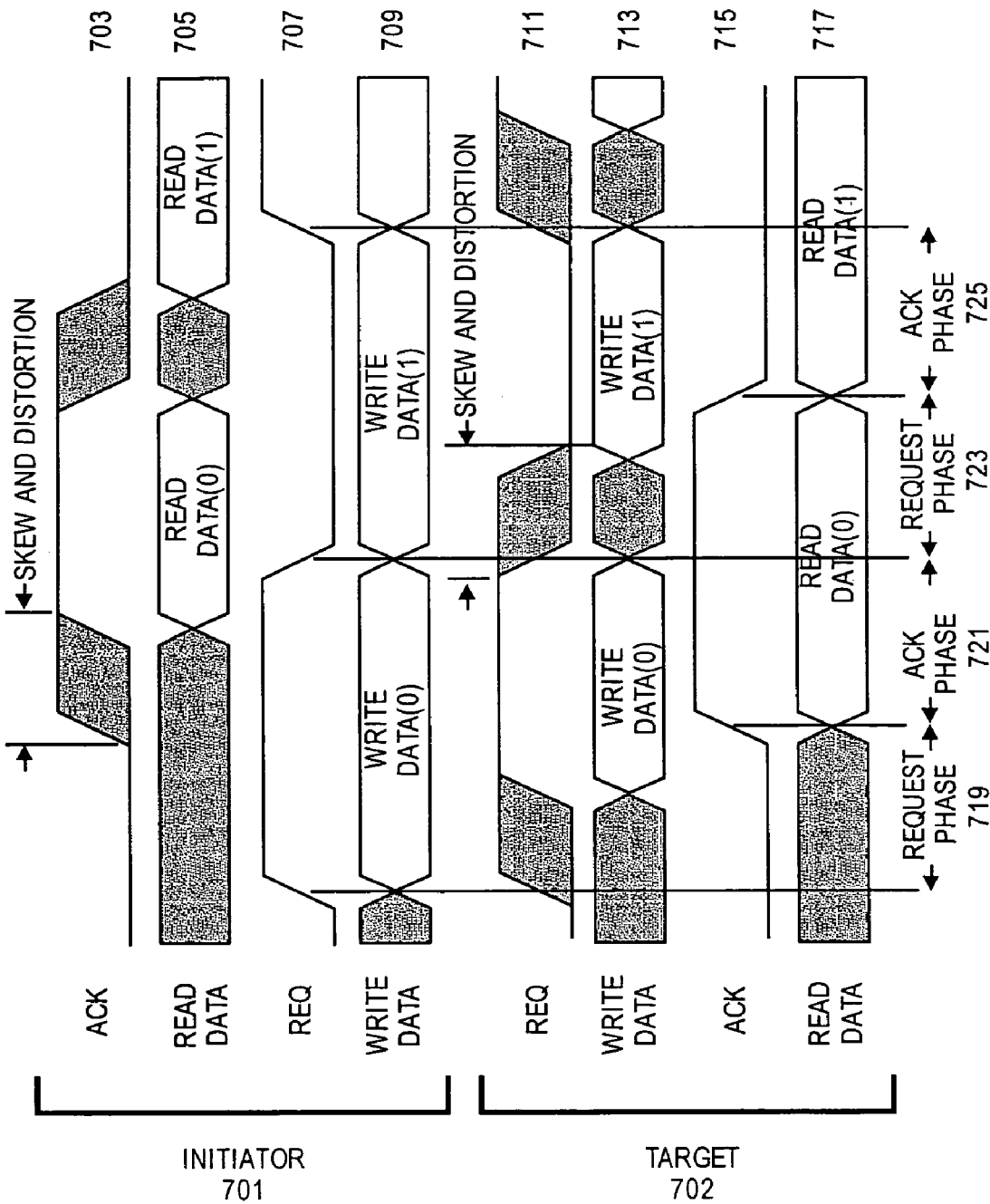
FIG. 7 is an example timing diagram of a set of signals between an initiator component and target component during a read and write operation.

FIG. 7 is a timing diagram and example where a write operation and read operation are performed simultaneously. The read and write operations are initiated by the toggling of the request signal on the request line 707 by the initiator component 701 starting a first request phase 719. This request signal may be received at the target component 702 on the incoming request line 711. The request signal may be accompanied with data to be written to the target component 702 on data lines 709. The write data may be received on incoming data lines 713 at the target component 702 at the time the request signal is received at the target component 702. This data may be written to the storage device associated with target 703. Target component 702, if capable of receiving more data and it has data to be sent, responds by toggling an acknowledgment signal on the outgoing acknowledgment line 715 starting an acknowledgment phase 721. This acknowledgement signal may be sent at the same time that read data is presented on the outgoing data lines 717.

In the example, the acknowledgment signal may be received at the initiator component along with the read data on the data lines 705. In response, if the initiator component 701 has sufficient space to receive further data and further data to send, a request signal on outgoing request line 707 may be toggled and the next write data block may be presented on the outgoing data bus 709. This starts the next request phase 723. This process may continue indefinitely into the next acknowledge phase 725 and beyond.

Figure 8A:
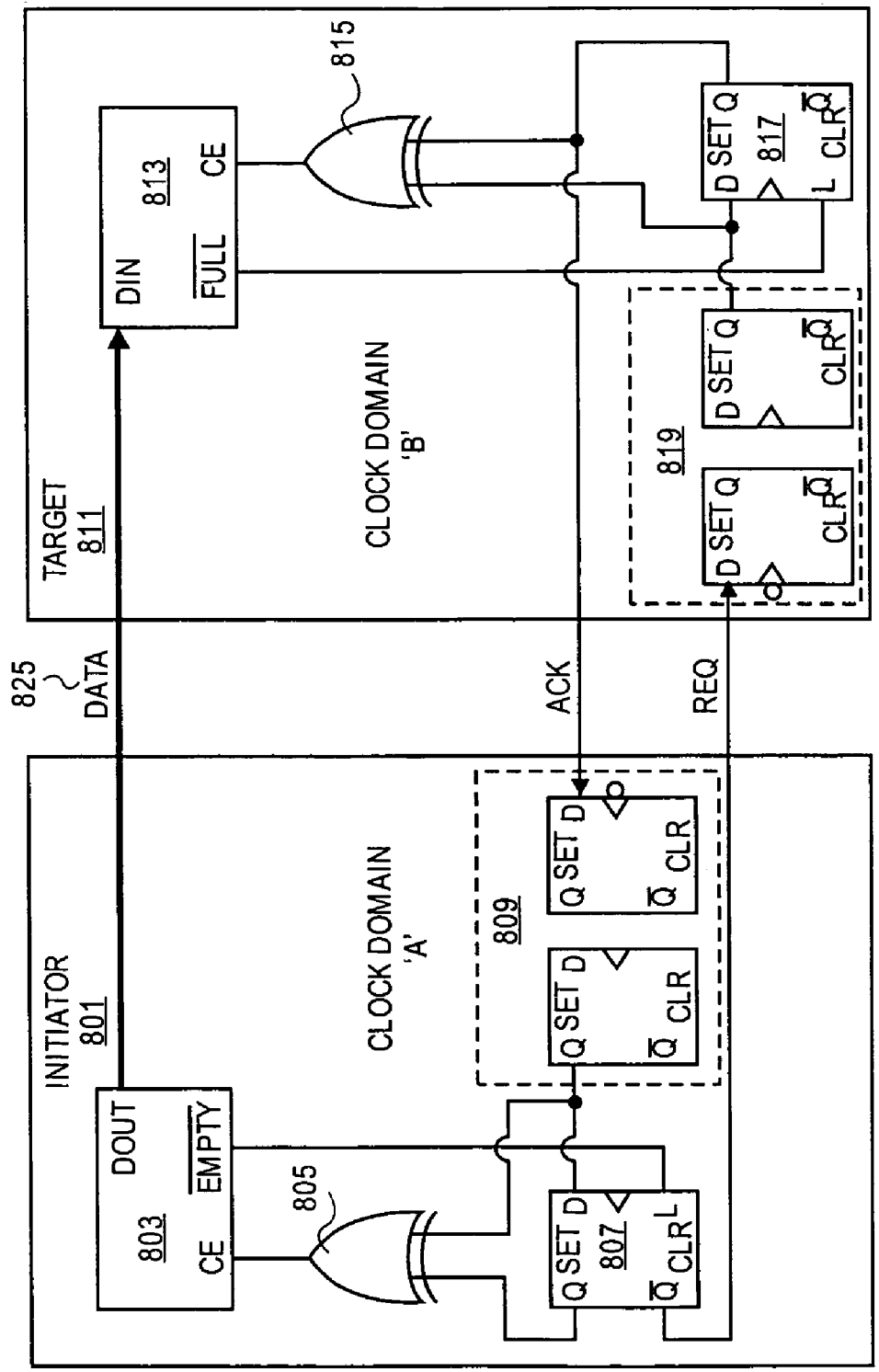
FIG. 8A is a diagram of one embodiment of initiator component and target component that operate in separate clock domains.

FIG. 8A is a diagram of one embodiment of the system where the initiator component and target component operate in different clock domains and are synchronous components. Initiator component 801 in this embodiment contains a storage device 803, control module 805, combined delay and signaling module 807 and a synchronization module 809. The target component 811 also contains a storage device 813, control module 815, combined delay and signal module 817 and synchronization module 819. The initiator component and target components and subcomponents operate in a fashion similar to those in asynchronous embodiment. The initiator component and target component both contain synchronization modules 809 and 819 that synchronize an incoming signal such as a signal on the request line or acknowledgment line with the clock domain of the component. A separate delay component may not be utilized because the initiator component and target component are synchronous devices instead of asynchronous devices. The storage devices 803 and 813 throttle the combined signal and delay modules 807 and 817 when the storage device 803 on the initiator side during a read operation is empty or when the storage device on the target side is full during a write operation.

Figure 8B:
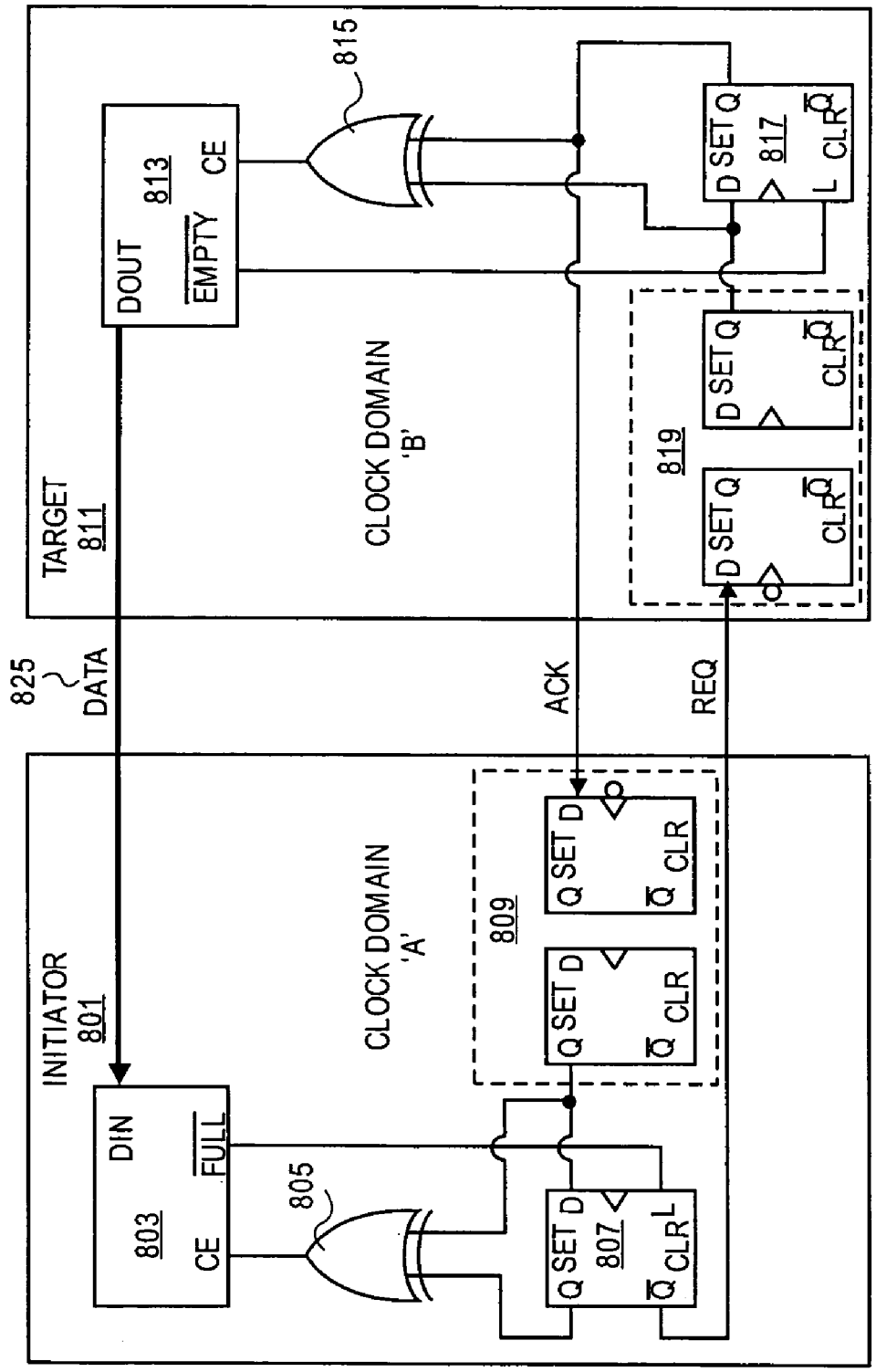
FIG. 8B is a diagram of one embodiment of an initiator component and target component operating in different clock domains.

FIG. 8B is a diagram of one embodiment of a synchronous initiator and target component interface capable of performing a read operation. The same subcomponents may be present in the initiator component 801 and target component 811 as were present in the synchronous write operation embodiment. The throttling of the combined signal and delay modules 807 and 817 are reversed so that the initiator component 801 disables the signaling module when its storage device is full and not able to receive data from the target component 811 and the target 811 disables the signaling module 817 when it is empty and has no data to send to the initiator component 801.

Figure 9A:
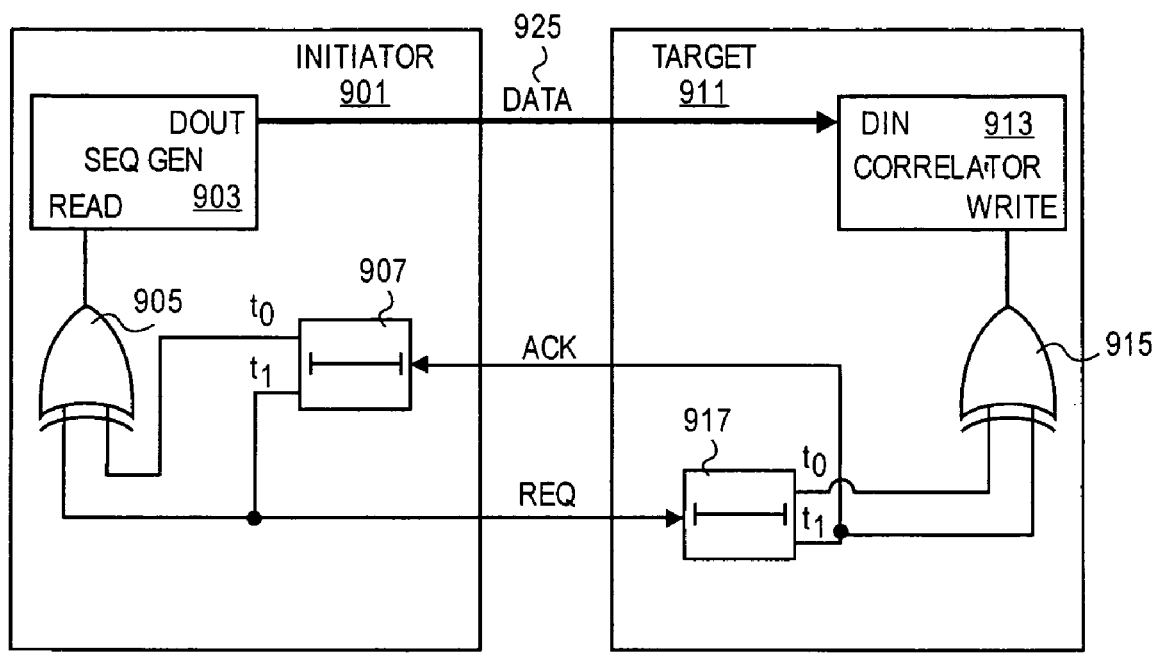
FIG. 9A is a diagram of one embodiment of an initiator component and target component that utilize a training sequence.
Figure 9B:
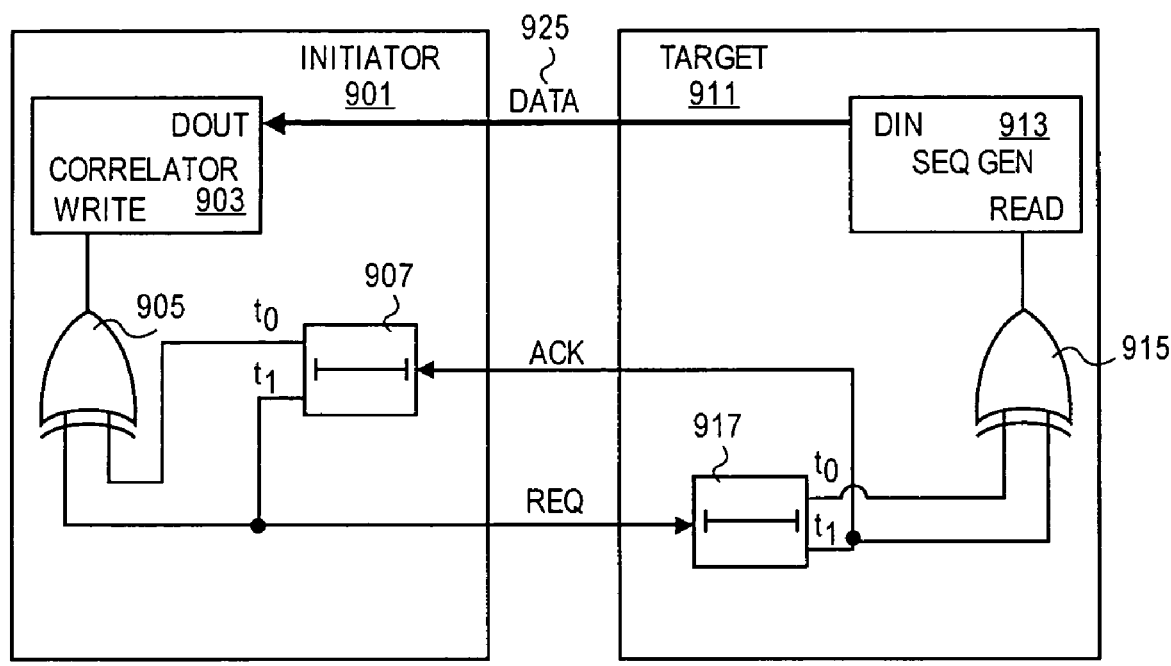
FIG. 9B is a diagram of one embodiment of an initiator component and target component that use a training sequence.

FIG. 9A and FIG. 9B show an embodiment of the initiator and target interface including a sequence generator and correlator to train the pair to communicate at a desired bit error rate. The previous embodiment, relied on known skew and distortion characteristics as well as manufacturing characteristics of the components to determine the necessary delay in handling signals. This embodiment of the initiator and target component interface may be utilized when the characteristics of the data link, acknowledgment lines and request lines are unknown between the initiator component 901 and target component 911. This embodiment may also be used in scenarios where it is desired that a specific bit error rate be maintained over time.

FIG. 9A is a diagram of an embodiment where the delay of the target component is trained. In one embodiment, the initiator component 901 and target component 911 may contain a sequence generator 903 and correlator 913, respectively. Sequence generator 903 may be coupled to the communication medium such as data bus 925 in parallel with a storage device or a similar component that communicates over the communication medium. The initiator component 901 also contains a delay module 907 and control module 905. These modules do not replace the modules in the synchronous and asynchronous embodiments discussed above, but rather are utilized during an initialization period or on a periodic basis to train the initiator component 901 based on the operating characteristics of the communication medium between the initiator component 901 and target component 911 and to maintain a specified error bit rate. The target component 911 may include a correlator 913 that is also coupled to the communication medium such as data bus 925. The target component 911 may also include the control module 915 and delay module 917. Again, these components do not replace the components discussed in regard to the synchronous or asynchronous embodiments, but rather are utilized during an initialization period or on a periodic basis to determine the current characteristics of the communication medium to maintain a specified error bit rate.

The sequence generator 903 may continuously send a training sequence that may be any number of data block over the communication medium to the target device. Initiator component 901 may simultaneously send a request signal with the training sequence. The target component 911 may receive a training sequence at the correlator 913 and may compare the incoming sequence with a known training sequence to determine the error rate in the incoming training sequence. The incoming request signals may be delayed by the delay module 917 to attempt to accommodate the skew and distortion on the line before passing the incoming signal over to the control module 915 that enables the comparison of the incoming signal with the known training sequence. If the comparison results in an error rate that is greater than desired, then the target component 911 may increase the delay in delay module 917 iteratively until the desired bit error rate is obtained.

FIG. 9B is a diagram of an embodiment for training the delay in the initiator component. In one embodiment, the initiator component 901 may receive the training sequence from the target component 911 at a correlator module 913 situated in the initiator component 901 and connected to the communication medium. The sequence generator 909 in the target component 911 may continuously transmit the training sequence until the initiator component 901 is able to tune the delay module 907 to account for a proper skew and distortion time period and to attain the desired bit error rate.

Figure 10:
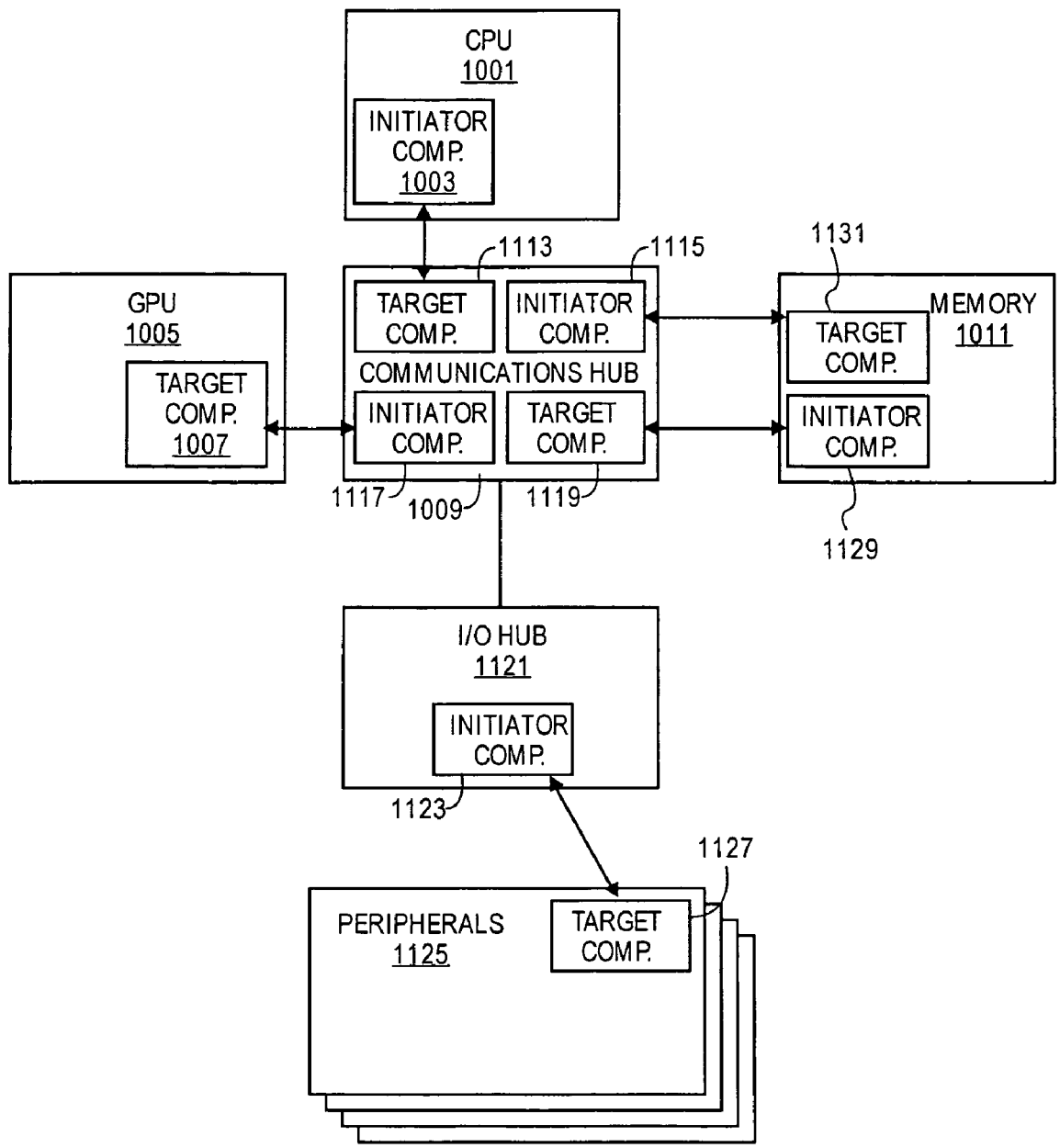
FIG. 10 is a diagram of one embodiment of a computer system utilizing initiator components and target components to communicate between the devices on the main board.

FIG. 10 is a diagram of one embodiment of a computer system utilizing an initiator-target component interface to manage communication between system components. In one embodiment, the computer system may include a central processing unit (CPU) 1001, communication hub 1009, memory device 1011, graphics processor 1007, IO hub 1121, set of peripherals 1125 and similar components. The CPU 1001 may be in communication with the communication hub via a bus. The CPU 1001 may control the communication with the communication hub 1009 with an initiator component 1003 that communicates over the bus with a target component 1113. Similarly, the communication hub 1009 may communicate with a memory device 1111 through an initiator component 1115 that communicates over a memory bus with target component 1131.

In one embodiment, the communication hub may have a bi-directional interface configuration to control communication over the memory bus with a memory 1111. The type of traffic may be divided between the initiator and target component pairs of the bi-direction or split interface. For example, in one embodiment, the communication hub 1009 may be in control of the write operations while the memory device 1011 may be in command of the execution of read operations by having an initiator component 1129. Data communication may be divided between any number of initiator and target component pairs to control communication over a bus or set of buses between any system components that support the initiator-target component interface.

In one embodiment, the computer system may have a many to one or one to many relationship between the initiator components and target components. For example, in one embodiment, the IO HUB 1121 may have an initiator component 1123 that is responsible for coordinating communication with a set of peripherals 1125 each having a target component 1127.

Figure 11:
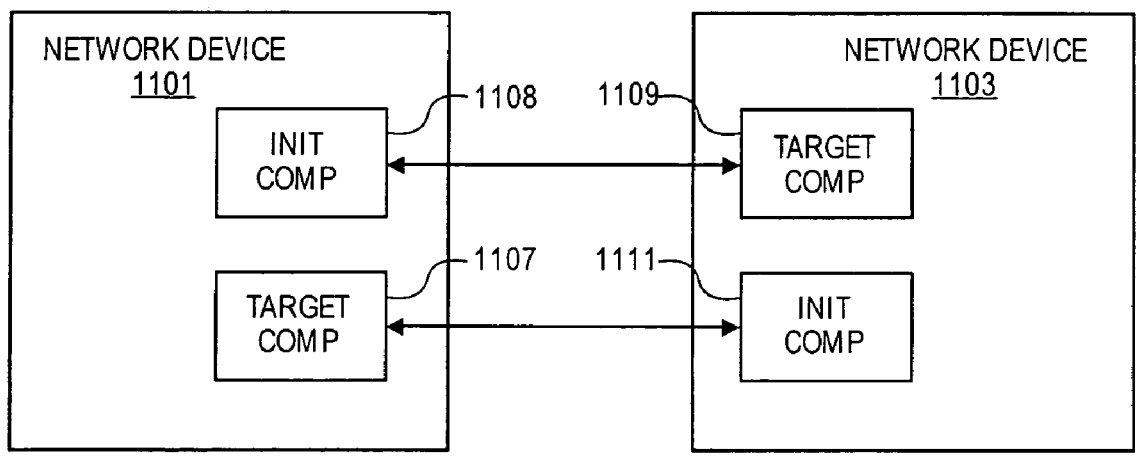
FIG. 11 is a diagram of one embodiment of a use of initiator components and target components in network devices.

FIG. 11 is a diagram of one embodiment of the use of the initiator component and target component interface to control communication over other types of communication media such as common networking communication media between network devices. In one embodiment, the initiator component and target component interface may be utilized to control communication over a communication medium such as optical or coaxial cable, radio frequency communication, satellite links or similar communication medium. This interface may be utilized to manage communication between network devices 1101, 1103, computers, handheld devices, console device and similar types of electronic devices. The interface may be utilized over any distance and at any scale. This interface may be used within an integrated circuit between circuits over printed circuit boards between network devices, over coaxial cable, optical lines, and similar communication medium. For example, devices may utilize a set of initiator component and target component pairs such as pairs 1105, 1109, 1107 and 1111 in the example network devices to manage traffic flow between device of any generation or speed.

The initiator-target component interface may be implemented in software, for example, in a simulator, emulator or similar software. A software implementation may include a microcode implementation. A software implementation may be stored on a machine readable medium. A "machine readable" medium may include any medium that can store or transfer information. Examples of a machine readable medium include a ROM, a floppy diskette, a CD-ROM, an optical disk, a hard disk, a radio frequency (RF) link, and similar media and mediums.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense.

What is claimed is:

1. A device comprising:
    a first storage device having a first communication capacity coupled to a second storage device having a second communication capacity over a communication medium, wherein the first and second communication capacities differ from one another;
    a signaling module coupled to the first storage device, the signaling module to signal one of an initiation of data transfer on a request line or an acknowledgement of received data on an acknowledgement line, the signaling module to throttle the rate of transfer over the communication medium; and
    a control module coupled to the first storage device, the control module to provide a read or write signal to the first storage device, wherein the control module receives a control signal to initiate the read or write signal and a delayed version of the control signal to end the read or write signal.

2. The device of claim 1 further comprising:
    a sequence generator to transmit a data sequence to be used to determine a delay time necessary to achieve a desired error bit rate.

3. The device of claim 1, further comprising:
    a correlator to receive a known data sequence and determine a delay time necessary to achieve a desired error bit rate.

4. The device of claim 1, further comprising:
    a synchronizing circuit to synchronize one of a request and acknowledge a signal to a clock domain of the device.

5. The device of claim 1, wherein the signaling module comprises:
    a latch that is enabled if the first storage device has receiving capacity.

6. The device of claim 1, further comprising:
    a delay module to delay an incoming signal based on the time necessary to compensate for skew and distortions over the communication medium.

7. The device of claim 1, wherein the request signal and acknowledge signal are non return to zero signals.

8. An apparatus, comprising:
    a first device having a first communication capacity to communicate with a second device having a second communication capacity over a communication medium, wherein the first and second communication capacities differ from one another;
    a signaling module coupled to the first device, the signaling module to signal one of an initiation of data transfer on a request line and an acknowledgement of received data on an acknowledgement line, the signaling module to throttle the rate of transfer over the communication medium; and
    a control module coupled to the first device, the control module to provide a read or write signal to the first device, wherein the control module receives a control signal to initiate the read or write signal and a delayed version of the control signal to end the read or write signal.

\* \* \* \* \*